(12) United States Patent
Pal et al.

(10) Patent No.: US 11,699,755 B2
(45) Date of Patent: Jul. 11, 2023

(54) STRESS INCORPORATION IN SEMICONDUCTOR DEVICES

(71) Applicant: Applied Materials, Inc., Santa Clara, CA (US)

(72) Inventors: Ashish Pal, San Ramon, CA (US); Mehdi Saremi, Santa Clara, CA (US); El Mehdi Bazizi, San Jose, CA (US); Benjamin Colombeau, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/000,546

(22) Filed: Aug. 24, 2020

(65) Prior Publication Data
US 2022/0059698 A1   Feb. 24, 2022

(51) Int. Cl.
*H01L 29/78*   (2006.01)

(52) U.S. Cl.
CPC ................... *H01L 29/7842* (2013.01)

(58) Field of Classification Search
CPC ......... H01L 21/02518; H01L 21/02524; H01L 21/02535; H01L 21/02576; H01L 21/02579; H01L 21/02592; H01L 21/0262; H01L 21/02373–02384; H01L 21/02417; H01L 21/02441–02452; H01L 21/02485; H01L 21/763; H01L 21/82345; H01L 21/823842; H01L 21/823462; H01L 21/823857; H01L 29/7842; H01L 29/7843; H01L 29/7845; H01L 29/7848; H01L 29/7856; H01L 29/66598; H01L 29/72; H01L 29/1025; H01L 29/1029; H01L 29/1045; H01L 29/66409; H01L 29/66568; H01L 29/66575; H01L 29/6606; H01L 29/66083; H01L 29/66037;

(Continued)

(56) References Cited

U.S. PATENT DOCUMENTS

| | | | |
|---|---|---|---|
| 7,786,025 B1 * | 8/2010 | Gluschenkov | ...... H01L 29/6659 438/799 |
| 8,889,500 B1 * | 11/2014 | Kamineni | ......... H01L 29/66545 438/176 |

(Continued)

*Primary Examiner* — Natalia A Gondarenko
(74) *Attorney, Agent, or Firm* — Kilpatrick Townsend & Stockton LLP

(57) ABSTRACT

Examples of the present technology include processing methods to incorporate stress in a channel region of a semiconductor transistor. The methods may include depositing a stressed material on an adjacent layer, where the adjacent layer is disposed between the stressed material and semiconductor material having an incorporated dopant. The adjacent layer may be characterized by an increased stress level after the deposition of the stressed material. The method may further include heating the stressed material and the adjacent layer, and removing the stressed material from the adjacent layer. The adjacent layer retains at least a portion of the increased stress after the removal of the stressed material. Examples of the present technology also include semiconductor structures having a conductive layer with first stress, and an intermediate layer with second stress in contact with the conductive layer. The second tensile stress may be at least ten times the first tensile stress.

14 Claims, 2 Drawing Sheets

(58) Field of Classification Search
CPC ......... H01L 29/66045; H01L 29/66636; H01L 29/66651; H01L 29/775; H01L 29/778; H01L 29/66545; H01L 29/4966; H01L 29/516; H01L 29/7847; H01L 29/785; H01L 29/6679; H01L 21/28088; H01L 21/765; H01L 21/845; H01L 21/823821; H01L 21/823807; H01L 21/823885; H01L 21/823878
USPC ........ 257/288, 192, 365, 347, 392; 438/197, 438/268, 151, 157, 478, 275
See application file for complete search history.

(56) References Cited

U.S. PATENT DOCUMENTS

| | | | |
|---|---|---|---|
| 9,899,522 B1* | 2/2018 | Liu | H01L 29/665 |
| 2013/0241004 A1* | 9/2013 | Yin | H01L 21/823807 |
| | | | 257/E27.061 |
| 2015/0251214 A1* | 9/2015 | Leschkies | D01F 6/50 |
| | | | 427/469 |
| 2016/0035891 A1* | 2/2016 | Xu | H01L 29/785 |
| | | | 257/288 |
| 2020/0126867 A1* | 4/2020 | Zhou | H01L 21/823878 |
| 2021/0143068 A1* | 5/2021 | Xu | H01L 21/823842 |

* cited by examiner

STRESS INCORPORATION IN SEMICONDUCTOR DEVICES

TECHNICAL FIELD

The present technology relates to methods for semiconductor processing. More specifically, the present technology relates to methods for incorporating increased stress in doped regions of semiconductor devices.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved methods that can be used to produce high quality devices and structures. These and other needs are addressed by the present technology.

SUMMARY

Embodiments of the present technology include processing methods to incorporate additional stress in a semiconductor substrate using a sacrificial stressed material. Exemplary locations for incorporating the additional stress include regions of semiconductor material having an incorporated dopant, such as a source region, a drain region, and a channel region under a gate of a semiconductor transistor. In some embodiments, the methods may include depositing a stressed material on an adjacent layer that is between the stressed material and the semiconductor material having an incorporated dopant. The adjacent layer may be characterized by increased stress after the deposition of the stressed material. The method may further include heating the stressed material and the adjacent layer. In some embodiments, the heating may be done with a rapid thermal process that raises the temperature of the material to several hundred degrees Celsius in less than or about one second. Embodiments of these rapid thermal processes include a spike anneal that heats the stressed material and adjacent layer at a heating rate greater than or about 200° C. The stressed material may be removed from the adjacent layer following the heating. As a result of the heating, the adjacent layer retains at least a portion of the increased stress after the removal of the stressed material. In some embodiments, the adjacent layer retains greater than or about 0.1% of the increased stress after the removal of the stressed material.

Embodiments of these methods include a stressed material made from a dielectric material or an electrically-conductive material. Additional embodiments include making a stressed, electrically-conductive material from one or more of tungsten, cobalt, copper, and aluminum. Embodiments further include the stressed material having a stress level greater than or about 1 GPa. In some embodiments, the adjacent layer upon which the stressed material is deposited may be characterized by a nominal viscosity less than or about $1.5 \times 10^6$ cP at 25° C. In further embodiments, at least a portion of the sacrificial stressed material may be replaced by a second material with low stress that makes contact with the adjacent layer. Embodiments include the second material being a conductive material such as a conductive metal. In some embodiments, the stressed material is a dielectric material that is replaced by a second material made of a conductive metal characterized by about neutral stress (e.g., stress of less than or about 0.1 MPa).

Embodiments of the present technology also include processing methods that deposit a stressed material on an adjacent layer, where the adjacent layer is characterized by a pre-deposition stress level before the stressed material is deposited on the adjacent layer. The methods may also include annealing the stressed material and the adjacent layer at a heating rate greater than or about 150° C./second. After the anneal, at least a portion of the stressed material may be replaced with a conductive material, and at least some of the conductive material may be in contact with the adjacent layer. The conductive material may be characterized by approximately neutral stress, and the adjacent layer may have a post-anneal stress that is greater than the pre-deposition stress as a result of the sacrificial stressed material imparting stress to the adjacent layer through the anneal. In some embodiments, the adjacent layer may have a post-anneal stress that is at least ten times greater than the stress of the conductive material.

Embodiments of these methods include a stressed material made from a dielectric material or an electrically-conductive material. Embodiments further include the stressed material having a stress level greater than or about 1 GPa. Additional embodiments include making the conductive material from one or more of tungsten, cobalt, copper, and aluminum. In some embodiments, the adjacent layer is formed between the stressed material and the semiconductor material having an incorporated dopant. In embodiments, the semiconductor material having an incorporated dopant may be a source region, a drain region, or a gate channel region of the semiconductor transistor.

Embodiments of the present technology may further include a semiconductor structure. The structure may include a conductive layer characterized by a first tensile stress. The structure may further include an intermediate (adjacent) layer in contact with the conductive layer. The intermediate layer may be characterized by a second tensile stress at least ten times the first tensile stress. The structure may still further include a semiconductor material having an incorporated dopant. The intermediate layer may be disposed between the conductive layer and the semiconductor material having the incorporated dopant.

Embodiments of the structure include the conductive layer characterized by a first tensile stress less than 0.1 MPa. Embodiments further include the conductive layer being made from at least one of tungsten, cobalt, copper, and aluminum. Embodiments also include the intermediate layer characterized by a second tensile stress of greater than or about 1 MPa. In some embodiments, the intermediate layer may be made from silicon oxide or silicon nitride. In further embodiments, the semiconductor material having an incorporated dopant may include a source region, a drain region, or a channel region of a semiconductor transistor.

Such technology may provide numerous benefits over conventional techniques. For example, embodiments of the present technology produce desired levels of stress in the channel region of a semiconductor transistor without changing the composition of the adjacent source and drain regions. In addition, the present technology originates the channel region stress from a removable stressed material which leaves behind an imprint of the stress on adjacent layers that can transmit the stress to the channel region. Because the stressed material is removable, it can be deposited with more defects that a permanent material. It can also be selected for its ability to impart stress without concern for other characteristics such as conductivity or hermeticity, among other ancillary characteristics. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
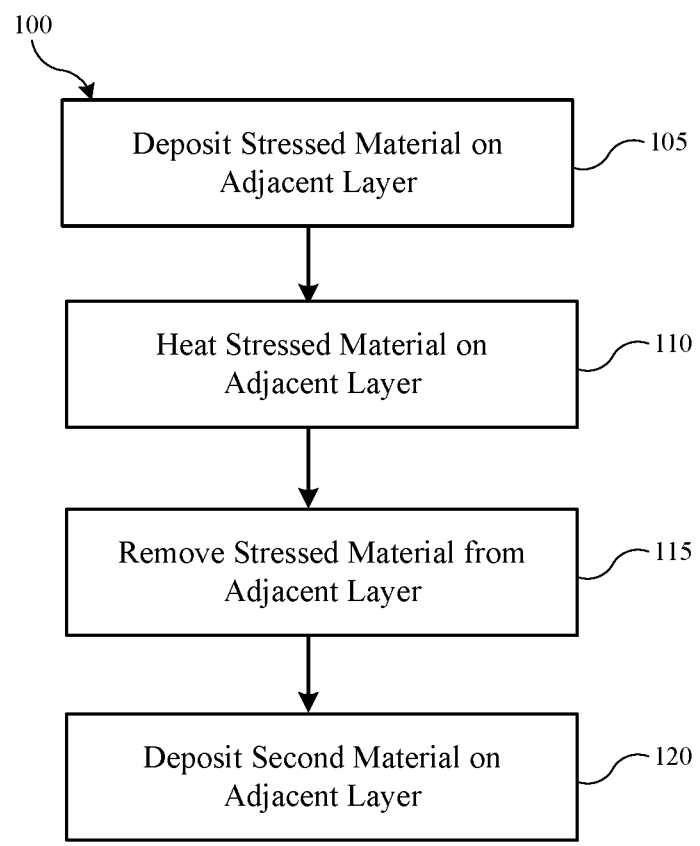
FIG. 1 shows operations in a semiconductor processing method according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes process methods for forming stress in a channel region of a semiconductor transistor, such as n-channel and p-channel MOSFETs, FinFETs, gate-all-around FETs, and nanosheet FETs, among other types of transistors. In conventional process methods, the stress level in the transistor channel may be controlled by altering the composition of the semiconductor materials in the channel, as well as the compositions of the materials in the adjacent source and drain regions. In many instances, the changes to the compositions of these doped regions of the transistor to give the channel region a desired amount of stress can lead to less desirable transistor performance in other respects, such as a lower thermal budget, and an increased resistance at the interface between the contact and the doped region, among other problems. Controlling channel region stress by altering the composition of the doped regions also limits the types of materials that can be used in the doped regions. For example, modern PMOS transistors often use a doped silicon-germanium (SiGe) semiconductor in the doped regions of the transistor. When the Ge-to-Si ratio gets too high, lattice mismatches create faults in the material that can reduce the channel region stress below an acceptable level.

Another conventional method for increasing the stress in a channel region of a transistor is depositing a stressed conductive material in the contact trench above the channel region. The stress from the conductive material is transmitted down to impart the required stress in the doped material of the channel region. These conventional methods also require careful selection and deposition of the conductive material in the contact trench to meet the stress requirements as well as the electrical conductivity, chemical reactivity, hermeticity, thermal budget, and other requirements for the material. In many instances, there must be a compromise in selecting a conductive material with less than ideal characteristics in some respects in order to satisfy the stress requirement. The changes in the deposition method or composition of the stressed material to create additional stress can diminish the performance of the material in other respects, such as electrical conductivity.

The present technology includes embodiments of methods to impart stress to a channel region of a transistor without having to alter the compositions of the doped regions of the transistor or leave high-stress conductive materials in the contact trenches. In embodiments of the present technology, the stresses originate with the deposition of a sacrificial stressed material on one or more layers of material that are adjacent to one or more doped region of the transistor. The stressed material may initially impart stress to the one or more layers, which in turn may transmit a portion of the stress to the channel region of the transistor. A heating operation may be performed so that at least a portion of the stress from the stressed material is retained by the one or more layers adjacent to the doped regions after the stressed material is removed. Embodiments of the heating operation include a rapid thermal anneal that heats the stressed material deposited on the one or more layers at a rapid heating rate of, for example, greater than or about 150° C./second.

The rapid heating leaves the materials in the one or more adjacent layers in a disordered state at the atomic level, and traps at least a portion of the stress in these layers that was initially imparted by contact with the stressed material. In one sense, the rapid heating step may be said to cause the one or more adjacent layers to "memorize" the stress from the stressed material. Following the heating operation, the one or more adjacent layers permanently retain at least a portion of the stress from the stressed material, and they can impart at least some of that memorized stress to the channel region of the transistor after the stressed material is removed. In contrast, a conventional thermal anneal (e.g., an anneal conducted at a heating rate of less than or about 10° C./second) is believed to give the material in the one or more adjacent layers time to come to a more ordered state at the atomic level, which can reduce the retained stress in the layers. Conventional thermal anneals can also take longer than rapid thermal anneals, which increase the process time and reduces production efficiencies. Additionally, conventional annealing that uniformly heats the entire substrate may affect thermal budget of incorporated materials. A more localized rapid thermal process such as laser spike annealing may afford the ability to anneal and temperatures well above a thermal budget, while limiting any impact on materials that may otherwise be compromised at those processing temperatures.

The present technology includes embodiments of process methods that impart stress from the sacrificial (i.e., temporary) stressed material to one or more adjacent layers. The ability to remove the sacrificial stressed material without removing all the stress imparted to the one or more adjacent layers addresses the above-described problems with conventional methods of imparting stress in the channel region of a transistor. The stress is imparted without needing to alter the composition of a semiconductor material having an incorporated dopant (e.g., a doped region of the transistor). It is also imparted without having to select and permanently deposit a stressed conductive material in the contact trenches above the semiconductor material having the incorporated dopant. Additional details about embodiments of the present technology, which addresses these and other problems, is provided below.

FIG. 1 shows exemplary operations in a processing method 100 according to some embodiments of the present technology. The methods may be included in a broader development of semiconductor structures, and may include additional operations to develop a structure including front-end processing, dummy gate formation, or any number of additional operations to form a structure to which an induced stress may provide beneficial impact. The method 100 may include depositing a sacrificial stressed material on an adjacent layer that is between the stressed material and a semiconductor material having an incorporated dopant (e.g., a doped region) 105, such as a contact liner in a FinFET structure. The doped region may be a source region, drain region, or channel region located adjacent to a gate of a semiconductor device. Exemplary semiconductor devices may include semiconductor transistors, such as n-channel and p-channel MOSFETs, FinFETs, gate-all-around FETs, and nanosheet FETs, among other types of semiconductor transistors. Exemplary semiconductor devices may include bulk semiconductor (e.g., silicon) devices, and semiconductor-on-insulator (SOI) devices.

In some embodiments, the sacrificial stressed material may be characterized by a stress of greater than or about 1 GPa. In additional examples, the stressed material may be characterized by a stress of greater than or about 2 GPa, greater than or about 3 GPa, greater than or about 4 GPa, greater than or about 5 GPa, greater than or about 6 GPa, or more. For the purposes of this application, a higher-stress materials is characterized by an absolute value of stress, either positive or negative, that is greater than the absolute value of a lower-stress material. The convention used here is that positive stress is characterized as tensile stress, negative stress is characterized as compressive stress, and no stress (i.e., 0 GPa) is characterized as neutral stress. Positive (i.e., tensile) stress may characterized by an outward pushing force that may be created by the expansion of a material. Negative (i.e., compressive) stress may be characterized by an inward pulling force that may be created by the contraction of the material.

The amount of stress in the stressed material may depend on the amount of stress that should be imparted to the channel region of the semiconductor device as a result of depositing the stressed material. In some embodiments, this may involve a determination of the amount of stress that remains in the one or more layers adjacent to the doped regions of the device after the stressed material is removed. Exemplary stressed materials may include an electrically conductive material such as tungsten, cobalt, copper, and aluminum, among other conductive materials. Additional exemplary stressed materials may include a dielectric material such as silicon oxide, silicon nitride, silicon oxycarbide, and carbon-containing organic materials, among other types of dielectric materials. The present technology permits a selection of a stressed material based primarily on its ability to generate an amount of lasting stress in adjacent layers following a heating operation. The selection of the sacrificial stressed material does require that the amount of stress be balanced with other properties of the material, such as its conductivity, permeability, etc., that is done for materials that remain on the substrate. This expands the number of candidate materials available to use as the stressed material, and permits the selection of stressed materials that would otherwise be disqualified based on other properties.

In embodiments, the one or more adjacent layers may be characterized by a nominal viscosity at 25° C. of $1.5 \times 10^6$ cP or less, $1 \times 10^6$ cP or less, $5 \times 10^5$ cP or less, $1 \times 10^5$ cP or less, $5 \times 10^4$ cP or less, $1 \times 10^4$ cP or less, or less. It is thought that a lower nominal viscosity of the adjacent layers permits an increased amount of the stress from the stressed material to be transmitted to the adjacent layers. In many instances, adjacent materials that experience an increased change in stress as a result of contact with the stressed material may permanently retain more of that increased stress following a rapid thermal anneal. Thus, the adjacent layers may be selected in part for their nominal viscosity and its effect on the incorporation and retention of stress from a sacrificial stressed material. In some embodiments, the adjacent layers may include silicon oxide having a nominal viscosity at 25° C. of about $5.25 \times 10^4$ cP, silicon nitride having a nominal viscosity at 25° C. of about $1.3 \times 10^6$ cP, and/or low-k, carbon-containing spacer material having a nominal viscosity at 25° C. of about $5.25 \times 10^4$ cP.

In embodiments, the one or more adjacent layers may be characterized by low stress relative to their stress following the deposition, heating, and removal of the sacrificial stressed material. In some embodiments, the adjacent layers may have about neutral stress (e.g., about 0 MPa stress) before the deposition of the stressed material. In additional embodiments, the adjacent layers may have stress less than or about 100 MPa, less than or about 50 MPa, less than or about 25 MPa, less than or about 10 MPa, less than or about 5 MPa, less than or about 1 MPa, less than or about 0.1 MPa, or less. The present technology permits the selection and deposition of one or more adjacent layers without requiring them to have a minimum about of stress. They may be formed in an as-deposited state with about neutral stress, and their stress level increased by the imparted and retained stress from the subsequently deposited stressed material.

Embodiments of the one or more adjacent layers may include materials that are selected based on the function of the layer. In some embodiments the one or more adjacent layers may include one or more liner layers that serve functions at the interface between the stressed material and the doped region. Embodiments of the liner layers may include barrier layers to prevent, for example, a fill material in the opening from contaminating the doped region, and conversely, to prevent doping-region materials from contaminating the fill material. Embodiments of the liner layers may also include transition layers to join a doped region material with a fill material with improved compatibility between the materials. Embodiments of the liner layers may further include seed layers to promote the deposition of a fill material in the opening. Embodiments of the liner layers may still further include etch stop layers (e.g., contact etch stop layers (CESLs)) that prevent etch operations from etching material beyond the layer. Additional embodiments of the one or more adjacent layers may include a dielectric layer formed over the semiconductor material having an incorporated dopant. In some embodiments, this dielectric layer may include silicon oxide, carbon-doped silicon oxide, silicon-oxynitride, and/or silicon nitride, among other dielectric materials. In some embodiments, one or more liner layers may be formed on the sidewall portions of the dielectric layer.

In some embodiments, the sacrificial stressed material may be deposited in and around a substrate feature, such as an opening. In some of these embodiments, one or more of the adjacent layers may help frame the opening, and may make contact with the sidewalls and/or bottom of the opening. In embodiments, the opening may be a contact trench positioned adjacent to a doped region of semiconductor material such as a source region, drain region, or channel region of a semiconductor transistor. The sacrificial stressed material may be deposited in the opening at a fast deposition rate to increase process efficiency. Deposition rates may be selected that create significant numbers of voids, seams or other defects in the fill. In most instances, these defects are not concerning since the stressed material will be removed from the opening after a heating operation to make permanent at least a portion of the stress imparted to the adjacent layers from the stressed material.

The method 100 may also include heating the sacrificial stressed material deposited on the one or more adjacent layers 110. In some embodiments, the heating operation may include a rapid thermal anneal of the substrate holding the sacrificial stressed material and one or more adjacent layers. Embodiments of the rapid thermal anneal include heating at a heating rate greater than or about 150° C./second, greater than or about 180° C./second, greater than or about 200° C./second, greater than or about 300° C./second, greater than or about 400° C./second, greater than or about 500° C./second, greater than or about 600° C./second, greater than or about 750° C./second, greater than or about 1000° C./second, or more. In embodiments, the heating may be done by heating the substrate with a heat lamp, a laser, a heating element in a pedestal supporting the substrate, or a plasma, among other heating components. In some embodiments, the heating may be done with a spike anneal that increases the temperature of the sacrificial stressed material at a heating rate greater than or about 150° C./second. In additional embodiments, the sacrificial stressed material may be heated for a period of less than or about 5 minutes. In still further embodiments, the annealed sacrificial material may be cooled at a cooling rate of less than or about 50° C./second. In additional embodiments, the heating may be done with a laser anneal that can heat one or more exposed layers of material to a temperature greater than or about 1000° C. in a period less than or about 1 millisecond. In further embodiments, a laser anneal may locally heat the sacrificial substrate material at a heating rate greater than or about $1 \times 10^{6\circ}$ C./second.

In some embodiments, the heating operation may involve heating targeted materials on regions of the substrate to a temperature greater than or about 700° C., greater than or about 750° C., greater than or about 800° C., greater than or about 850° C., or greater than or about 950° C., or more. This may allow anneal affects at high temperature to be imparted, while maintaining the substrate below budgeted temperatures. In some embodiments, the anneal temperature may directly affect the amount of memorized stress in the underlying material. By performing a spike anneal, temperatures well beyond thermal budget requirements may be used, while limiting any damage to the underlying materials or structure.

As noted above, a rapid thermal anneal of the sacrificial stressed material and the one or more adjacent layers permits the adjacent layers to memorize at least a portion of the stress imparted by the stressed material. The memorized stress is retained by the adjacent layers after the removal of the sacrificial stressed material. It is thought that the rapid temperature changes affected by a rapid thermal anneal creates and maintains the atomic structure in a more disordered state that helps the adjacent layers retain the imparted stress. In some embodiments, the percentage of the initial stress imparted by the stressed material to an adjacent layer that is retained by the adjacent layer may be greater than or about 0.1%, greater than or about 0.3%, greater than or about 0.5%, greater than or about 1%, greater than or about 2%, greater than or about 3%, greater than or about 4%, greater than or about 5%, or more.

The method 100 may further include removing the stressed material from the one or more adjacent layers 115. In some embodiments, the removal may be done by an etch or polishing of the stressed material from the substrate. In embodiments, the etching processes may include wet etching and dry etching. In further embodiments, the dry etching may include a selective plasma etch that selectively removes the sacrificial stressed material over the one or more adjacent layers. In still further embodiments, removal of the stressed material may include chemical mechanical polishing (CMP) of the stressed material off an exposed surface of the substrate.

In some embodiments, the method 100 may also include depositing a second material to replace the sacrificial stressed material 120. In embodiments, the second material may be deposited by chemical vapor deposition on the one or more adjacent layers. Embodiments of the chemical vapor deposition method may include plasma-enhanced chemical vapor deposition, and high-density plasma chemical vapor deposition, among other CVD processes. The second material may be an electrically-conductive material made from, for example, tungsten, cobalt, copper, aluminum, and combinations thereof, among other conductive materials. In some embodiments, the second material may be an electrically-conductive metal that is deposited in a contact trench, among other places on the substrate, that was formerly filled with the stressed material. The electrically-conductive metal forms at least a portion of the metal contact between a doped region of a semiconductor transistor (e.g., a source region or a drain region of the transistor) and additional conductive components such as a via interconnect and/or metal stack interconnect.

Embodiments of the second material may be characterized by stress less than the stressed material it replaces. Embodiments further include a second material characterized by stress that is lower than the stress in the one or more adjacent layers post-anneal. For example, one or more of the adjacent layers may be characterized by a post-anneal stress at least ten times greater than the second-material stress, at least fifteen times greater than the second-material stress, at least twenty times greater than the second-material stress, at least thirty times greater than the second-material stress, at least forty times greater than the second-material stress, at least fifty times greater than the second-material stress, or more. In some embodiments, the as-deposited second material may be characterized by a stress level of less than or about 100 MPa, less than or about 50 MPa, less than or about 25 MPa, less than or about 10 MPa, less than or about 5 MPa, less than or about 1 MPa, less than or about 0.1 MPa, or less. In some embodiments, the as-deposited second material may be characterized by about neutral stress. The present technology permits a selection of a second material based primarily on characteristics other than its ability to generate an amount of lasting stress in adjacent layers and doped regions of the substrate. For example, the second material and its deposition may be selected for its electrical conductivity to provide a low-resistance, local connect between a doped region of a semiconductor transistor and additional conductive components in an integrated circuit.

As noted above, embodiments of the present technology may be used to fabricate semiconductor device structures, including semiconductor transistors such as n-channel and p-channel MOSFETs, FinFETs, gate-all-around FETs, and nanosheet FETs, among other types of transistors. FIGS.

Figure 2A:
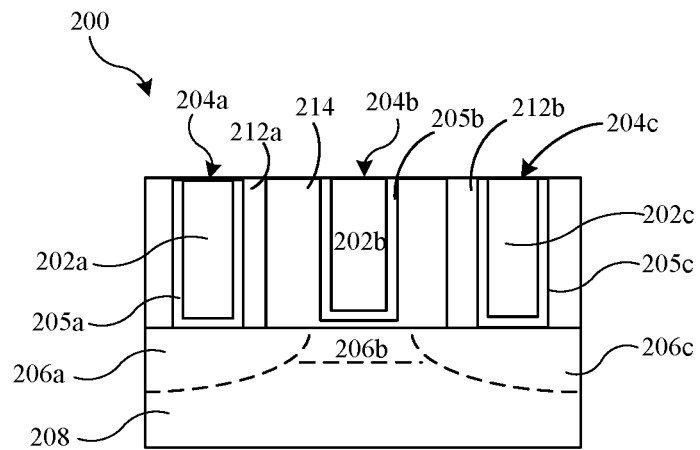
FIGS. 2A-2C show cross-sectional views of exemplary semiconductor structures according to some embodiments of the present technology.

2A-C show simplified cross-sections of a semiconductor structure during selected operations in embodiments of the present methods. In the embodiment shown, one or more stressed materials are replaced one or more conductive materials in three contact trenches. In other embodiments (not shown), stressed materials in one or two of the contact trenches may be replaced with conductive materials. FIG. 2A shows an embodiment of a semiconductor structure 200 that includes one or more sacrificial stressed materials 202a-c deposited in one or more contact trenches 204a-c that include one or more intermediate (adjacent) layers 205a-c. The sacrificial stressed materials 202a-c may be characterized by an amount of stress greater than the stress in the intermediate layers 205a-c at least before the stressed materials 202a-c contact the intermediate layers 205a-c. After contact, the stress in the one or more intermediate layers 205a-c increases from a lower-stress, first stress amount to a higher-stress, second stress amount. In some embodiments, the percentage change in the stress of an intermediate layer 205a-c from the first stress amount to the second stress amount may be greater than or about 0.1%, greater than or about 1%, greater than or about 2%, greater than or about 5%, greater than or about 10%, greater than or about 25%, greater than or about 50%, greater than or about 75%, greater than or about 100%, or more. In additional embodiments, the first stress amount in an intermediate layer 205a-c may be less than or about 10 MPa, less than or about 5 MPa, less than or about 1 MPa, or less. In further embodiments, the second stress amount in an intermediate layer 205a-c may be greater than or about 1 MPa, greater than or about 5 MPa, greater than or about 10 MPa, greater than or about 50 MPa, greater than or about 100 MPa, or more.

The intermediate layers 205a-c may be positioned between the one or more stressed materials 202a-c and a semiconductor material having an incorporated dopant, which may be described as dopant regions 206a-c. In the embodiment shown in FIGS. 2A-C, additional materials 212a-b and 214 may be positioned between the intermediate layers 205a-c and the dopant regions 206a-c. In some embodiments, one or more of these additional materials 212a-b and 214 may be intermediate layers that are characterized by an increase in stress as a result of the stressed materials 202a-c. The dopant regions 206a-c may be part of a larger substrate, which is represented as substrate region 208. In some embodiments, the dopant region may be a source region, a drain region, or a channel region of a semiconductor transistor. A portion of the increased stress created by the one or more stressed materials 202a-c in one or more of the intermediate layers 205a-c may create increased stress in the dopant region 206. In some embodiments, the percentage change in the stress in one or more of the dopant regions 206a-c caused by the increased stress in the one or more intermediate layers 205a-c may be greater than or about 0.1%, greater than or about 1%, greater than or about 2%, greater than or about 5%, greater than or about 10%, greater than or about 25%, greater than or about 50%, greater than or about 75%, greater than or about 100%, or more.

In some embodiments, the

Figure 2B:
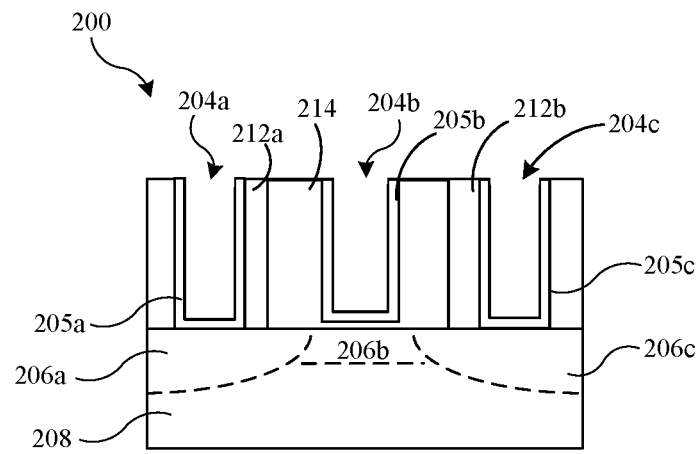

As noted above, embodiments of the present technology include the removal of the one or more sacrificial stressed materials 202a-c from one or more of the intermediate layers 205a-c. FIG. 2B shows the substrate structure with the one or more stressed materials 202a-c removed. The adjacent layers 205a-c have retained at least a portion of the increased stress created by the stressed material as a result of a rapid thermal anneal performed prior to the removal. In some embodiments, the percentage of the stress retained by the one or more intermediate layers 205a-c after removal of the one or more stressed materials 202a-c may be greater than or about 5%, greater than or about 10%, greater than or about 15%, greater than or about 20%, greater than or about 30%, greater than or about 40%, greater than or about 50%, greater than or about 60%, greater than or about 70%, greater than or about 80%, greater than or about 90%, or more.

Figure 2C:
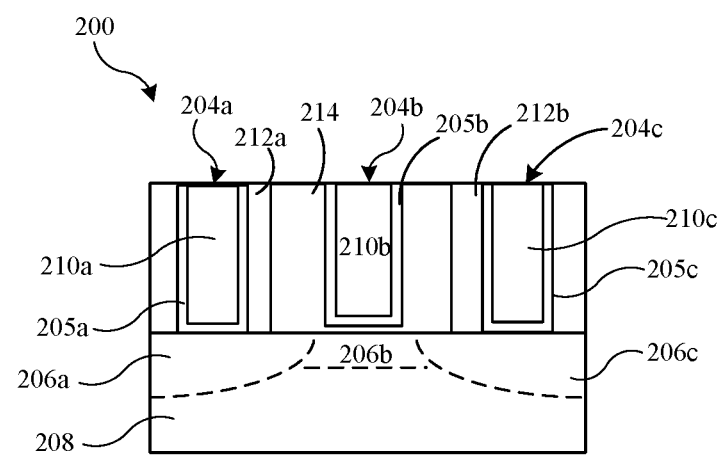

The removal of the stressed material permits its replacement with a new material that may be better suited for permanent incorporation into the semiconductor device and integrated circuit. FIG. 2C shows one or more electrically-conductive materials 210a-c replacing the one or more sacrificial stressed materials 202a-c in one or more intermediate layers 205a-c. Embodiments of the one or more conductive materials 210a-c may be made from a conductive metal such as tungsten, cobalt, copper, aluminum, or combinations thereof. The one or more conductive materials 210a-c may be characterized by tensile stress significantly lower than that retained in the one or more intermediate layers 205a-c or the one or more removed stressed materials 202a-c. In some embodiments, the one or more intermediate layers 205a-c may be characterized by tensile stress at least ten times the stress in the one or more conductive materials 210a-c. In additional embodiments, the difference in tensile stress between the one or more intermediate layers 205a-c and the one or more conductive materials 210a-c may be greater than or about fifteen times, greater than or about twenty times, greater than or about fifty times, greater than or about one hundred times, greater than or about two hundred times, or more. In further embodiments, the difference in tensile stress between the one or more stressed materials 202a-c and the one or more conductive layers 210a-c may be greater than or about one hundred times, greater than or about two hundred times, greater than or about five hundred times, greater than or about one thousand times, greater than or about two thousand times, or more. In some embodiments, the lower stress may facilitate a lower resistivity and higher conductivity in the one or more conductive materials 210a-c.

Embodiments of the present technology create and retain an increased stress in an intermediate (adjacent) layer from the deposition and removal of a sacrificial stressed material. The retained stress imparted by the intermediate layer creates increased stresses in nearby regions of semiconductor material having an incorporated dopant, including a channel region of a semiconductor device. Increasing the stress of the channel region may improve device performance on one or more measures. For example, the increased stress in the channel region is thought to increase the mobility of charge carriers in the channel, which increases the drive current through the channel region. In some embodiments, the increased stress created in the channel region by embodiments of the present technology may increase the drive current through a transistor channel by greater than or about 1%, greater than or about 2%, greater than or about 3% greater than or about 4%, greater than or about 5%, greater than or about 10%, or more. An increase in drive current through the channel region can increase transistor performance in a number of respects including increased switching speed, and reduced power consumption, among others. Embodiments of the present technology accomplishes these improvements in semiconductor device performance without constraining the types of materials used in the devices that may create new processing problems or compromise device performance in other respects.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
    depositing a stressed material on an adjacent layer, wherein the adjacent layer is disposed between and in contact with each of the stressed material and a substrate comprising doped source and drain regions, and wherein the adjacent layer is characterized by an increased stress level after the deposition of the stressed material, wherein the stressed material has a tensile stress greater than or about 4 GPa;
    heating the stressed material and the adjacent layer; and
    removing the stressed material from the adjacent layer, wherein the adjacent layer retains at least a portion of increased stress after the removal of the stressed material.

2. The semiconductor processing method of claim 1, wherein the heating of the stressed material and the adjacent layer comprises a spike anneal at a heating rate greater than or about 150° C./second.

3. The semiconductor processing method of claim 1, wherein the method further comprises depositing a second material on the adjacent layer after the removal of the stressed material.

4. The semiconductor processing method of claim 1, wherein the adjacent layer retains greater than or about 0.1% of the increased stress after the removal of the stressed material.

5. The semiconductor processing method of claim 1, wherein the stressed material comprises a dielectric material or an electrically-conductive metal.

6. The semiconductor processing method of claim 5, wherein the electrically-conductive metal comprises tungsten, cobalt, copper, or aluminum.

7. The semiconductor processing method of claim 1, wherein the stressed material has a tensile stress greater than or about 6 GPa.

8. The semiconductor processing method of claim 1, wherein the adjacent layer comprises a material characterized by a nominal viscosity of less than or about $1.5 \times 10^6$ cP at 25° C.

9. A semiconductor processing method comprising:
    depositing a stressed material on an adjacent layer, wherein the adjacent layer has a pre-deposition stress, wherein the adjacent layer defines a contact trench in which the stressed material is deposited, and wherein the adjacent layer is disposed in contact with a substrate defining doped source and drain regions;
    annealing the stressed material and the adjacent layer at a heating rate greater than or about 150° C./second; and
    replacing at least a portion of the stressed material with a conductive material in contact with the adjacent layer, wherein the conductive material extends into one or more contact trenches, wherein the adjacent layer has annealed stress after the replacement of the stressed material with the conductive material, and wherein the annealed stress is greater than the pre-deposition stress.

10. The semiconductor processing method of claim 9, wherein the stressed material comprises a dielectric material or an electrically-conductive metal.

11. The semiconductor processing method of claim 9, wherein the stressed material has a stress level greater than or about 1 GPa.

12. The semiconductor processing method of claim 9, wherein the adjacent layer is between the stressed material and a semiconductor material having an incorporated dopant.

13. The semiconductor processing method of claim 9, wherein the conductive material comprises tungsten, cobalt, copper, or aluminum.

14. The semiconductor processing method of claim 1, further comprising:
    replacing the stressed material with a conductive material, wherein the stressed material is fully removed.

* * * * *